(12) United States Patent (10) Patent No.: US 9,147,099 B2
Perezselsky et al. (45) Date of Patent: Sep. 29, 2015

(54) APPARATUS AND METHOD FOR FINGERPRINTING SENSING

(71) Applicant: SYNAPTICS INCORPORATED, San Jose, CA (US)

(72) Inventors: Armando Leon Perezselsky, Mesa, AZ (US); Richard Brian Nelson, Chandler, AZ (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 14/247,137

(22) Filed: Apr. 7, 2014

(65) Prior Publication Data

US 2014/0219523 A1 Aug. 7, 2014

Related U.S. Application Data

(63) Continuation of application No. 12/716,122, filed on Mar. 2, 2010, now Pat. No. 8,716,613.

(51) Int. Cl.
| | |
|---|---|
| *G06K 9/00* | (2006.01) |
| *H01L 23/498* | (2006.01) |
| *H05K 1/02* | (2006.01) |
| *H01L 23/48* | (2006.01) |
| *H01L 23/60* | (2006.01) |
| *H05K 1/14* | (2006.01) |
| *H05K 3/00* | (2006.01) |

(52) U.S. Cl.
CPC .......... *G06K 9/00053* (2013.01); *G06K 9/0002* (2013.01); *H01L 23/481* (2013.01); *H01L 23/49805* (2013.01); *H05K 1/0259* (2013.01); *H01L 23/60* (2013.01); *H01L 2924/0002* (2013.01); *H05K 1/141* (2013.01); *H05K 3/0052* (2013.01); *H05K 2201/09181* (2013.01); *H05K 2201/10151* (2013.01); *Y10T 29/49165* (2015.01)

(58) Field of Classification Search
None
See application file for complete search history.

(56) References Cited

U.S. PATENT DOCUMENTS

| | | | |
|---|---|---|---|
| 5,963,679 A | 10/1999 | Setlak | |
| 6,399,994 B2 | 6/2002 | Shobu | |
| 7,200,250 B2 | 4/2007 | Chou | |
| 7,505,613 B2 | 3/2009 | Russo | |
| 8,204,281 B2 | 6/2012 | Satyan et al. | |
| 8,374,407 B2 | 2/2013 | Benkley et al. | |
| 8,618,910 B2 * | 12/2013 | Setlak et al. | 340/5.83 |
| 2003/0123714 A1 | 7/2003 | O'Gorman et al. | |
| 2004/0081339 A1 | 4/2004 | Benkley, III | |
| 2006/0055500 A1 | 3/2006 | Burke et al. | |

(Continued)

*Primary Examiner* — Kenneth B Lee, Jr.
(74) *Attorney, Agent, or Firm* — Leydig, Voit & Mayer, Ltd.

(57) ABSTRACT

A biometric sensor apparatus and method are disclosed, which may comprise a flexible substrate comprising a first side surface and a second side surface opposing the first side surface; a biometric sensor portion comprising biometric image sensing elements formed on the second side surface forming at least part of a biometric sensor array sensing capacitively induced changes induced by a biometric in the vicinity of the biometric image sensing elements; a biometric sensor controller integrated circuit mounted to the flexible substrate on one of the first side surface and the second side surface of the flexible substrate; an edge surface of the flexible substrate including at least one conductively plated perforation in the flexible substrate; and an electro-static discharge element formed on or as part of the flexible substrate and electrically connected to the at least one conductively plated perforation.

31 Claims, 6 Drawing Sheets

(56) References Cited

U.S. PATENT DOCUMENTS

| | | |
|---|---|---|
| 2006/0170528 A1 | 8/2006 | Fukushige et al. |
| 2006/0182319 A1 | 8/2006 | Setlak et al. |
| 2007/0086634 A1 | 4/2007 | Setlak et al. |
| 2009/0001999 A1 | 1/2009 | Douglas |
| 2009/0130369 A1 | 5/2009 | Huang et al. |
| 2009/0155456 A1 | 6/2009 | Benkley et al. |
| 2009/0174974 A1 | 7/2009 | Huang et al. |
| 2010/0244166 A1 | 9/2010 | Shibuta et al. |
| 2013/0258086 A1 | 10/2013 | Erhart et al. |

\* cited by examiner

APPARATUS AND METHOD FOR FINGERPRINTING SENSING

CROSS-REFERENCE

This application is a continuation of Ser. No. 12/716,122, filed Mar. 2, 2010, entitled Apparatus and Method for Electrostatic Discharge Protection by Armando Leon Perezelsky, et al., which is incorporated herein by reference in its entirety and to which application priority is claimed under 35 USC §120.

BACKGROUND

Electrostatic discharge (ESD) is a serious problem for many types of solid state electronics, such as integrated circuits (ICs). Electronic components such as ICs can be exposed to ESD from various different sources, such as the human body, assembly equipment, or basic packaging materials. Contact between the sources and a grounded IC can generate large enough currents through the IC to significantly damage its internal circuitry.

The effects of ESD create special problems with touch electronics, i.e., electronics intended for touching by the body. For example, electronic fingerprint sensors allow a user to swipe or press a finger over some portion of the circuit in order to read the user's fingerprint. It would be impractical or inconvenient for a user to have to ground his or her body prior to touching the sensor in order to dissipate an electrostatic charge.

Conventional fingerprint sensors include a silicon chip with an exposed surface fir receiving human touch. These fingerprint sensors can be easily damaged physically or mechanically because of the exposed surface, reducing the durability and/or reliability of the sensor. The conventional fingerprint sensors as well as newer, more advanced "flexible" fingerprint sensors, which enable a user to swipe a finger across a polyimide surface without directly contacting the sensor circuitry, are both susceptible to ESD damage. For example, electrostatic charge can build up on the polyimide surface of the flexible fingerprint sensor as a user swipes his or her finger. This charge can continue to increase in potential until the path of least resistance is found and the charge dissipated. In certain cases, the charge can discharge to the sensor circuitry, causing damage to sensitive electronic components such as IC input/output cells.

The current ESD protection used in the fingerprint sensor industry uses a metal ring surrounding the perimeter of the sensor. This arrangement requires an additional metal layer in the sensor manufacture, thus increasing the cost of the sensor. The inventions disclosed herein teach a new kind of ESD protection for touch electronics that reduces the manufacture cost and increase the durability of the electronics.

SUMMARY

Some embodiments of the invention provide a substrate capable of receiving electrostatic discharge. The substrate includes an edge surface including at least one plated castellation capable of conducting the electrostatic discharge. The substrate also includes a bottom surface, a top surface, and a circuit trace along at least one of the bottom surface and the top surface, the circuit trace electrically connected to the at least one plated castellation.

Some embodiments of the invention provide a method of constructing a substrate with electrostatic discharge protection. The method includes providing a substrate array including a plurality of substrates, punching holes along at least a portion of a perimeter of each of the plurality of substrates, and plating the holes with a conductive material. The method also includes cutting each of the plurality of substrates along cut lines that bisect at least some of the holes and connecting the conductive material on each of the plurality of substrates to a known potential.

It will be understood that biometric sensor apparatus and method are disclosed, which may comprise a flexible substrate comprising a first side surface and a second side surface opposing the first side surface; a biometric sensor portion comprising biometric image sensing elements formed on the second side surface forming at least part of a biometric sensor array sensing capacitively induced changes induced by a biometric in the vicinity of the biometric image sensing elements; a biometric sensor controller integrated circuit mounted to the flexible substrate on one of the first side surface and the second side surface of the flexible substrate; an edge surface of the flexible substrate including at least one conductively plated perforation in the flexible substrate; and an electro-static discharge element formed on or as part of the flexible substrate and electrically connected to the at least one conductively plated perforation. The at least one conductively plated perforation may be plated with a conductive material including one of copper, aluminum, nickel, and gold. The at least one conductively plated perforation may comprise a plurality of conductively plated perforations positioned on the periphery of the flexible substrate. At least one of the plurality of conductively plated perforations may be electrically connected to a known potential. The sensor and method may comprise at least one other biometric image sensing element formed on the other of the first side surface and the second side surface of the flexible substrate remote from the biometric sensor controller integrated circuit and electrically coupled to the biometric sensor controller integrated circuit, wherein the at least one other biometric image sensing element transmits information to the biometric sensor controller integrated circuit. The biometric may comprise a fingerprint. The first side surface may provide an area for a finger to be swiped.

The biometric object image sensor and method may comprise a flexible substrate comprising a first side surface and a second side surface opposing the first side surface; a biometric image sensor portion comprising biometric image sensing elements formed on one of the first side surface and the second side surface forming at least part of a biometric sensor element trace array sensing capacitively induced changes induced by a biometric in the vicinity of the biometric image sensing element trace array; a biometric sensor controller integrated circuit mounted to the flexible substrate on one of the first side surface and the second side surface of the flexible substrate; the flexible substrate mounted on a connecting substrate, comprising a ball grid array mounting for connecting the biometric sensor controller to an apparatus utilizing the biometric object image sensor. The biometric object image sensor and method may comprise the connecting substrate comprising a printed circuit board. The flexible substrate may comprise an area for a biometric object to be brought into proximity to the biometric object sensing element traces. The biometric object image sensor and method may comprise the image sensor traces comprising an array of capacitive gap biometric object image pixel elements, e.g., a linear array.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Figure 1:
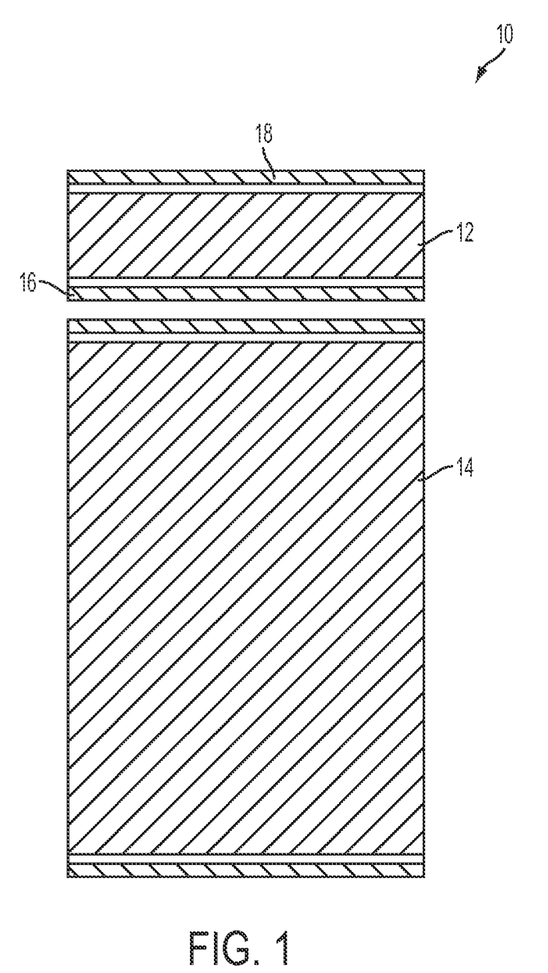
FIG. 1 is a side view of a fingerprint sensing circuit according to one embodiment of the invention.

FIG. 1 illustrates a fingerprint sensing circuit 10 according to one embodiment of the invention. The fingerprint sensing circuit 10 can have a two-substrate architecture including a top substrate 12 and a bottom substrate 14. The top substrate 12 can be constructed of a flexible or rigid material suitable for applying a circuit thereon. In one embodiment, the top substrate 12 can be constructed of a flexible polyimide material, such as Kapton®, with a thickness of between about 5 and about 100 micrometers. The bottom substrate 18 can be a conventional printed circuit board (PCB).

Figure 2:
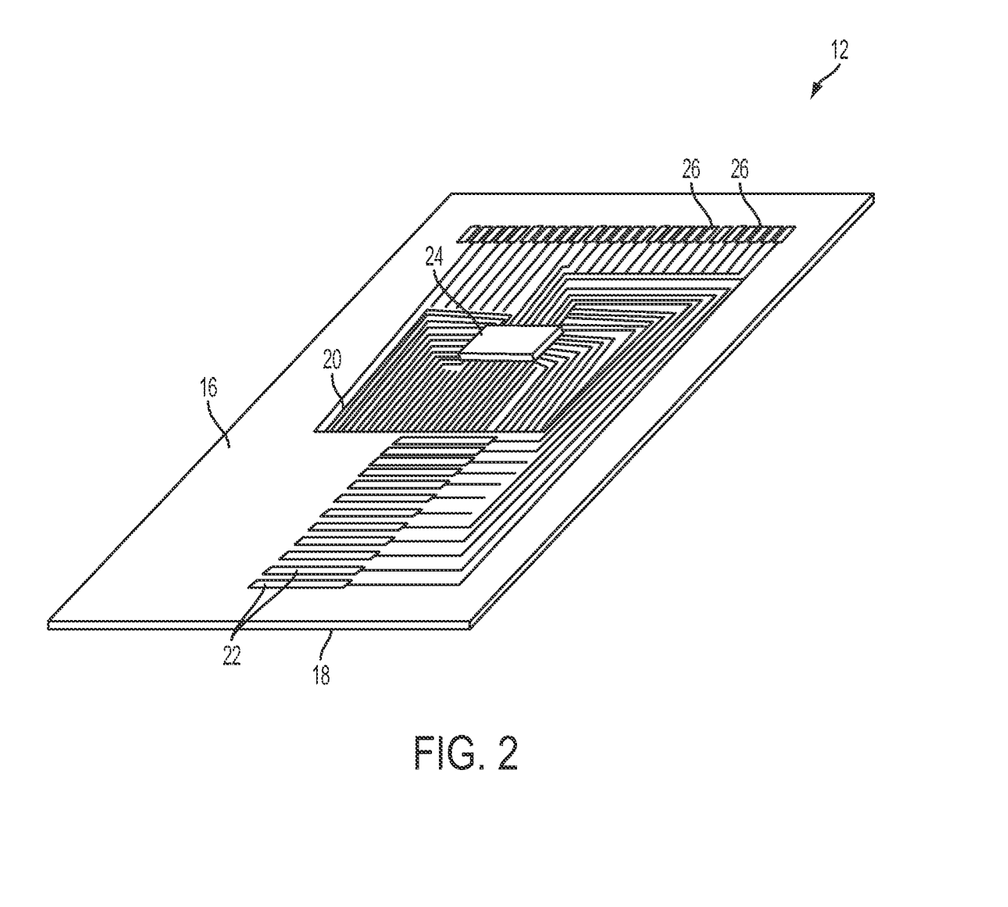
FIG. 2 is a perspective bottom view of a top substrate of the fingerprint sensing circuit of FIG. 1.
Figure 3:
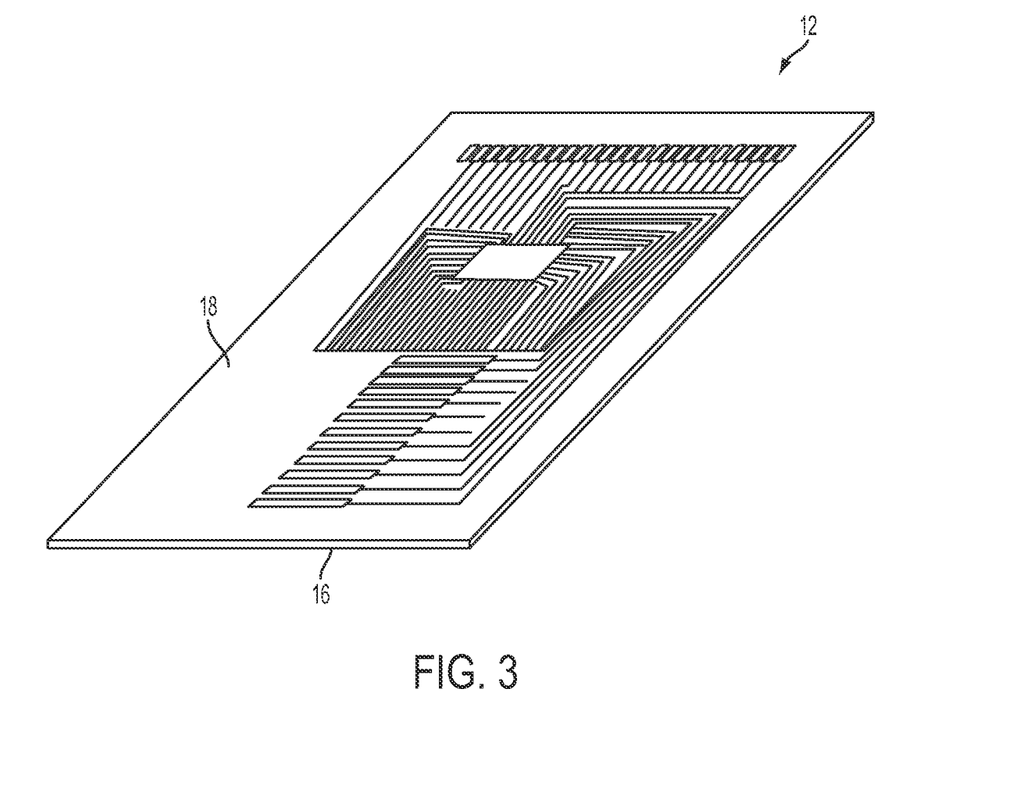
FIG. 3 is a perspective top view of a top substrate of the fingerprint sensing circuit of FIG. 1.

FIGS. 2 and 3 illustrate the top substrate 12. The top substrate 12 can have a circuit side 16, as shown in FIG. 2, and a sensing side 18, as shown in FIG. 3. The circuit side 16 of the top substrate 12 can be attached to the bottom substrate 14 via a chip-on-flex (COF) process, wire bonding, anisotropic conductive film (ACF), etc.

In some embodiments, the fingerprint sensing circuit 10 can include an image sensor 20 to detect the ridges and valleys of a fingerprint as a finger moves across the image sensor 20. The fingerprint sensing circuit 10 can also include a velocity sensor 22 to detect the speed of a finger moving across the image sensor 20. The image sensor 20 and/or the velocity sensor 22 can be bonded to the circuit side 16 of the fingerprint sensing circuit 10. For example, the image sensor 20 and/or the velocity sensor 22 can be constructed of conductive traces (e.g., copper traces) printed or applied to the circuit side 16 using a lithographic technique, as shown in FIG. 2. In some embodiments, the image sensor 20 can be implemented as an array of capacitive sensors capable of sensing the ridges and valleys of a finger as it travels over the sensor 20. In addition, the velocity sensor 22 can be implemented using two or more capacitive detectors at intervals along the direction of travel of the finger.

Fingerprint information sensed by the image sensor 20 and the velocity sensor 22 can be transmitted to one or more sensor integrated circuits (ICs) 24 connected to the circuit side 16 of the top substrate 12. The sensor IC 24 can be bonded to the top substrate 12 using a suitable technique such as a chip-on-flex (COF) process, wirebond, flip chip, anisotropic conductive film (ACF) adhesive, underfil, glob-top, etc. The sensor IC 24 can include drive and sense electronics for interpreting the fingerprint information from the image sensor 20 and the velocity sensor 22. In one embodiment, the sensor IC 24 can be a silicon chip or die. In addition, in some embodiments, the image sensor 20 and the velocity sensor 22 can be contained within the sensor IC 24 (e.g., rather than being positioned external to the sensor IC 24, as described above).

During use, a user's finger can be swiped along the sensing side 18 of the top substrate 12. On the circuit side 16 of the top substrate 12, the image sensor 20 and the velocity sensor 22 can detect changes in capacitance as the finger is swiped. As a result of having a separate sensing side 18 and circuit side 16, the top substrate 12 can substantially electrically and mechanically isolate the user's finger from the image sensor 20, the velocity sensor 22, and the sensor IC 24, thereby providing some degree of protection from electrostatic discharge (ESD) and mechanical abrasion.

Figure 4:
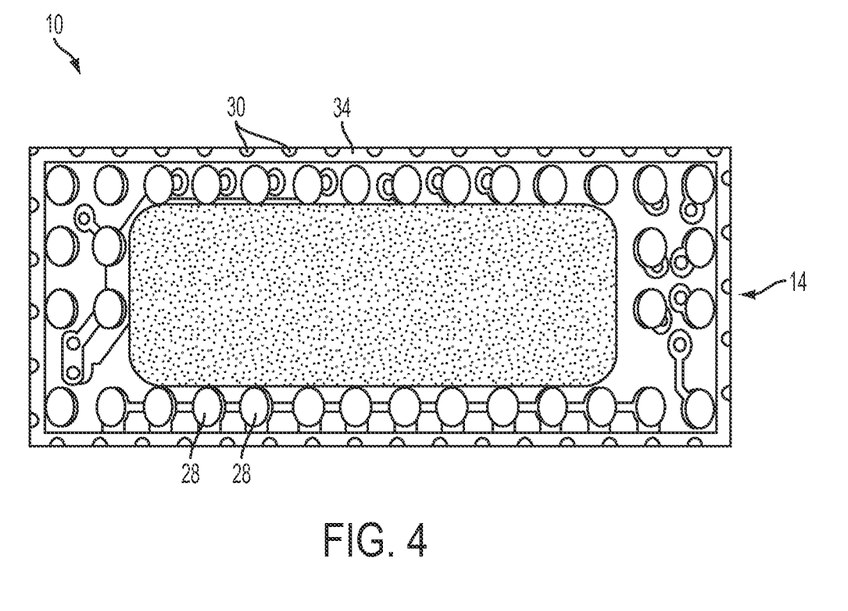
FIG. 4 is a bottom view of a bottom substrate of the fingerprint sensing circuit of FIG. 1.

In some embodiments, the top substrate 12 can include interconnect pads 26 that allow the sensor IC 24 to interface with the bottom substrate 14. The bottom substrate 14 can include, for example, power supply circuitry, external communication circuitry, etc. for the sensor IC 24. FIG. 4 illustrates the bottom substrate 14 according to one embodiment of the invention. As shown in FIG. 4, the underside of the bottom substrate 14 can include a ball grid array (BGA) 28 to electrically connect the fingerprint sensing circuit 10 to a substrate of a product.

In one embodiment, the fingerprint sensing circuit 10 can have a single-substrate architecture, where the single substrate has a sensing side and an opposite circuit side. Thus, the substrate can include a sensor IC on its circuit side and a user's finger can be swiped along the opposite, or sensing side. As the user's finger is swiped along the sensing side, the sensor IC, with separate or integral image and velocity sensors, can detect the user's fingerprint through the substrate using techniques such as capacitive, thermal, radio frequency (RF), infrared (IR), light-gathering, and/or ultrasonic techniques. The single substrate can also include other circuitry, such as power supply circuitry, external communications circuitry, etc. on its circuit side.

In another embodiment, the fingerprint sensing circuit 10 can have a single-substrate architecture, where the single substrate has a combined circuit and sensing side. Thus, the substrate can include a sensor IC on the same side that the user's finger is swiped. An epoxy "glob-top" over the sensing side can protect the sensor IC from mechanical damage and/or contamination. The sensor IC, including an integral image sensor and/or a velocity sensor, can sense and collect fingerprint information by coming in direct contact with the user's finger through the epoxy. The sensor IC can detect the user's fingerprint using techniques such as capacitive, thermal, RF, IR, light-gathering and/or ultrasonic techniques.

In yet another embodiment, the fingerprint sensing circuit 10 can have a single-substrate or two-substrate architecture, where both sides of the top substrate can include sensing circuitry. The top substrate can include an image sensor and a velocity sensor on the sensing side (i.e., same side that the user's finger is swiped). An epoxy glob-top or an ink, layer can be applied over the sensing side to protect the image sensor and the velocity sensor from mechanical damage and/or contamination. The sensor IC can be applied to the opposite, circuit side. The image sensor and the velocity sensor can sense fingerprint information by coming in direct contact with the user's finger through the epoxy or ink layer and transmit the fingerprint information to the sensor IC through, for example, RF transmissions. Other circuitry, or a bottom substrate, can also be coupled to the circuit side of the top substrate.

In some embodiments, the one or more substrates of the fingerprint sensing circuit 10 (i.e., the substrate of the single-substrate architecture or one or both of the substrates of the two-substrate architecture) can include a plated portion around its outside edge surface. The plated portion can be plated with a conductive plating (e.g., copper, aluminum, gold, nickel, etc.) and can be connected to a circuit trace along a top, bottom, or inner surface of the one or more substrates. The circuit trace can be connected to a low impedance path to a known potential, such as power source ground. As a result, the outside edge of the one or more substrates can allow a controlled path for ESD to be removed from the fingerprint sensing circuit 10 (i.e., from the plated portion, along the circuit trace, to power source ground).

For example, ESD can build up on the sensing side as a user swipes his or her finger. This charge can continue to increase in potential until the path of least resistance is found and the charge dissipated. The plated outside edge and the circuit trace can create the shortest discharge path for ESD, thus preventing ESD from discharging to the sensor IC or any other components of the circuit side or bottom substrate and potentially damaging them. In some embodiments, the plated portion can completely surround the outside edge of the one or more substrates. In other embodiments, the plated portion can partially surround the outside edge of the one or more substrates. In addition, the plated portion can extend down the entire thickness, or only a portion of the thickness, of the outside edge of the one or more substrates.

Figure 5:
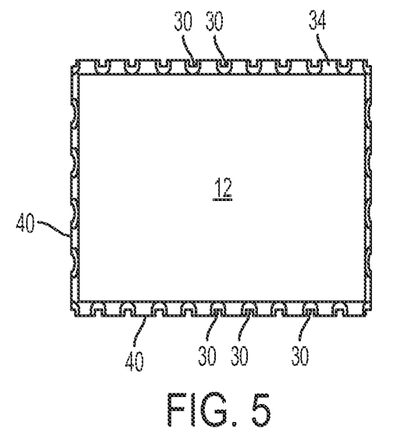
FIG. 5 is a top view of a top substrate of the fingerprint sensing circuit of FIG. 1.
Figure 6A:
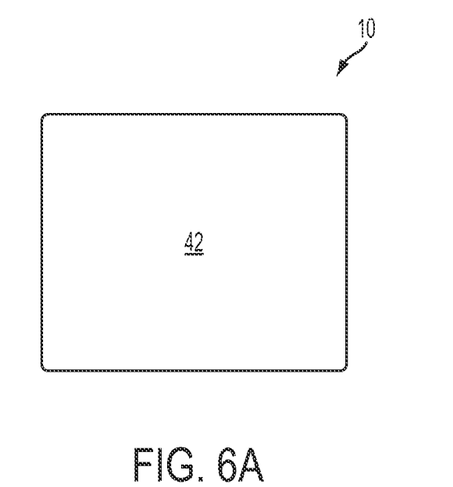
FIG. 6A is a top view of the fingerprint sensing circuit of FIG. 1.
Figure 6B:
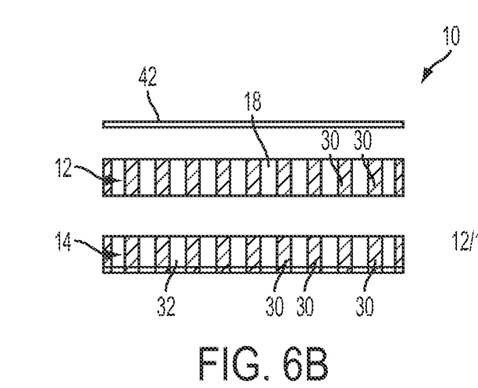
FIG. 6B is an exploded side view of the fingerprint sensor of FIG. 1.
Figure 6C:
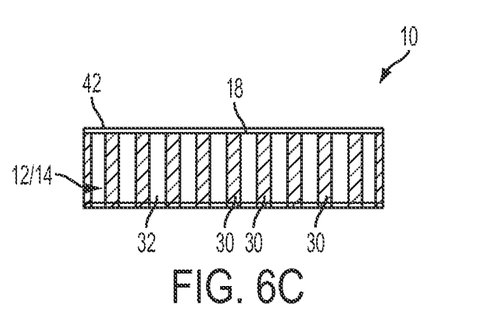
FIG. 6C is another side view of the fingerprint sensing circuit of FIG. 1.

In one embodiment, the plated portion can be in the form of plated castellations 30, or perforations. For example, FIGS. 4-6C illustrate a fingerprint sensing circuit with the two-substrate architecture according to one embodiment of the invention. As shown in FIGS. 6B and 6C, the substrates 12, 14 can include the plated castellations 30 down their outside edge surfaces 32. The castellations 30 can be interconnected by a circuit trace 34 along a top surface of the top substrate 12, as shown in FIG. 5, and/or a bottom surface of the bottom substrate 12, as shown in FIG. 4. The circuit trace 34 can be connected to power source ground. As a result, the plated castellations 30 and the circuit trace can create the shortest discharge path for ESD. In one embodiment, each of the plated castellations 30 can be directly connected to power source ground, rather than interconnected through the circuit trace.

In some embodiments, the castellations 30 can completely surround the outside edge 32 of one or both of the substrates 12, 14 at a constant or varying pitch. In other embodiments, the castellations 30 can partially surround the outside edge 32 of one or both of the substrates 12, 14. FIGS. 4 and 5 illustrate the castellations with a smooth, semi-circular cross-section. In other embodiments, the castellations can have semi-circular, semi-square, semi-rectangular, and/or semi-triangular cross-sections.

Figure 7:
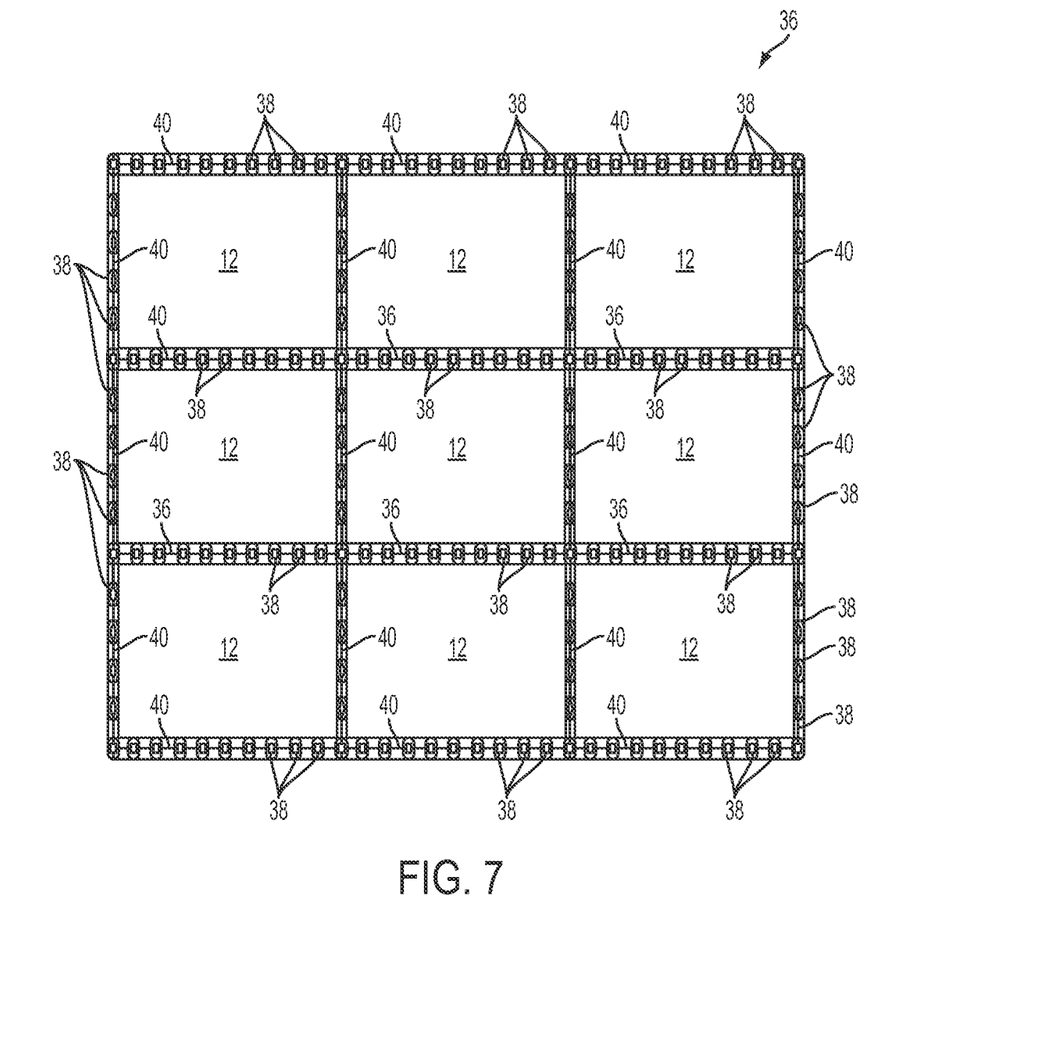
FIG. 7 is a top view of a substrate array for use with a fingerprint sensing circuit according to one embodiment of the invention.

In some embodiments, multiple substrates can be created from a single substrate array 36. For example, FIG. 7 illustrates a substrate array 36 including nine separate substrates 12 (and/or substrates 14) fir nine fingerprint sensing circuits 10. As shown in FIG. 7, prior to stamping out individual substrates 12, via holes 38 can be punched around a perimeter of each substrate 12 and plated. In some embodiments, the via holes 38 can be punched and plated around only a portion of the perimeter of each substrate 12 (not shown). In addition, the via holes 38 can be all through holes, all blind holes, or some combination of through holes and blind holes. Further, the via holes 38 can have a circular cross-section, as shown in FIG. 7, or a square, rectangular, and/or triangular cross-section.

After the via holes 38 have been punched and plated around each perimeter, the substrates 12 can be cut or stamped out. Cut lines 40 made by the cutting or stamping mechanism can divide the via holes 38, thereby creating the castellations 30, as shown in FIG. 5. Accordingly, each castellation 30 can be a fraction of a via hole 38. For example, FIG. 5 shows some castellations 30 created from via holes 38 that have been bisected and some castellations 30 created from via holes 38 that have been quartered (e.g., at corners of the substrate 12). After the via holes 38 are punched, and before or after the substrates 12 are stamped from the substrate array 36, other layers or coatings 42, such as an epoxy glob-top or an ink layer, can be coupled to the substrate 12, as shown in FIGS. 6A-6C. When the fingerprint sensing circuit 10 is viewed from above, as shown in FIG. 6A, the coating 42 can substantially hide the castellations 30.

The fingerprint sensing circuits 10 described above can be applied to products other than fingerprint sensors, such as sensing circuits for touchpads and molded plastics having a variety of shapes and contours. In addition, the plated outside edge or castellation method described above can be applied to various other devices to protect circuitry from ESD. For example, the plated outside edge or castellation method can be used to protect sensitive circuitry associated with devices intended for human touch, including but not limited to PCBs for touch pads, touch screens, touch panels, keyboards, keypads, mice, joysticks, trackballs, etc. which can be collectively referred to as "touch electronics circuits" herein.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the Wowing claims.

What is claimed is:

1. A biometric sensor comprising:
a flexible substrate comprising a first side surface and a second side surface opposing the first side surface;
a biometric sensor portion comprising biometric image sensing elements formed on the second side surface forming at least part of a biometric sensor array sensing capacitively induced changes induced by a biometric in the vicinity of the biometric image sensing elements;
a biometric sensor controller integrated circuit mounted to the flexible substrate on one of the first side surface and the second side surface of the flexible substrate;
an edge surface of the flexible substrate including at least one conductively plated perforation in the flexible substrate; and
an electro-static discharge element formed on or as part of the flexible substrate and electrically connected to the at least one conductively plated perforation.

2. The sensor of claim 1, wherein the at least one conductively plated perforation is plated with a conductive material including one of copper, aluminum, nickel, and gold.

3. The sensor of claim 1, wherein the at least one conductively plated perforation comprises a plurality of conductively plated perforations positioned on a periphery of the flexible substrate.

4. The sensor of claim 3, wherein at least one of the plurality of conductively plated perforations is electrically connected to a known potential.

5. The sensor of claim 1, further comprising at least one other biometric image sensing element formed on the other of the first side surface and the second side surface of the flexible substrate remote from the biometric sensor controller integrated circuit and electrically coupled to the biometric sensor controller integrated circuit, wherein the at least one other biometric image sensing element transmits information to the biometric sensor controller integrated circuit.

6. The sensor of claim 5, wherein the biometric comprises a fingerprint.

7. The sensor of claim 6, wherein the first side surface provides an area for a finger to be swiped.

8. A method of constructing a biometric sensor comprising:
providing a flexible substrate comprising a first side surface and a second side surface opposing the first surface;
providing a biometric sensor portion comprising biometric image sensing elements formed on the second side surface forming at least part of a biometric sensor array sensing capacitively induced changes induced by a biometric in the vicinity of the biometric image sensing elements;
providing a biometric sensor controller integrated circuit mounted to the flexible substrate on one of the first side surface and the second side surface of the flexible substrate;
punching via holes at least partially through the flexible substrate along at least a portion of a perimeter of the flexible substrate;
plating the via holes with a conductive material; and
electrically connecting the plating of at least some of the vias holes to an electrostatic discharge element formed on or as part of the flexible substrate.

9. The method of claim 8, wherein the electrostatic discharge element comprises an electrostatic discharge element trace formed on one of the first side or the second side of the flexible substrate.

10. The method of claim 9, wherein the electrostatic discharge element trace is configured to be connected to a power source ground.

11. The method of claim 8, further comprising electrically connecting a sensor controller integrated circuit to one of the first side and the second side of the flexible substrate.

12. The method of claim 11, further comprising attaching the flexible substrate to another substrate having a ball grid array on a bottom surface of the another substrate.

13. The method of claim 8, wherein the via holes are punched along the entire perimeter of the flexible substrate.

14. The method of claim 12, wherein the flexible substrate and the another substrate are coupled together.

15. A biometric object image sensor comprising:
a flexible substrate comprising a first side surface and a second side surface opposing the first side surface;
a biometric image sensor portion comprising biometric image sensing elements formed on one of the first side surface and the second side surface forming at least part of a biometric sensor element trace array sensing capacitively induced changes induced by a biometric in the vicinity of the biometric image sensing element trace array;
a biometric sensor controller integrated circuit mounted to the flexible substrate on one of the first side surface and the second side surface of the flexible substrate;
an edge surface of the flexible substrate including at least one conductively plated perforation in the flexible substrate; and
an electro-static discharge element formed on or as part of the flexible substrate and electrically connected to the at least one conductively plated perforation;
wherein the flexible substrate is mounted on a connecting substrate comprising a ball grid array mounting for connecting the biometric sensor controller to an apparatus utilizing the biometric object image sensor.

16. The biometric object image sensor of claim 15, wherein the connecting substrate comprises a printed circuit board.

17. The biometric object image sensor of claim 15, wherein the flexible substrate comprises an area for a biometric object to be brought into proximity to the biometric object sensing element traces.

18. The biometric object image sensor of claim 15, wherein the biometric object image sensor traces comprise an array of capacitive gap biometric object image pixel elements.

19. The biometric object image sensor of claim 18, wherein the array of capacitive gap biometric object image pixels comprises a linear array.

20. A biometric sensor comprising:
a substrate comprising a first side surface and a second side surface opposing the first side surface;
a biometric sensor portion comprising biometric image sensing elements formed on the second side surface forming at least part of a biometric sensor array sensing capacitively induced changes induced by a biometric in the vicinity of the biometric image sensing elements;
a biometric sensor controller integrated circuit mounted to the substrate on one of the first side surface and the second side surface of the substrate;
an edge surface of the substrate including at least one conductively plated perforation in the substrate; and an electro-static discharge element formed on or as part of the substrate and electrically connected to the at least one conductively plated perforation.

21. The sensor of claim 20, wherein the at least one conductively plated perforation is plated with a conductive material including one of copper, aluminum, nickel, and gold.

22. The sensor of claim 20, wherein the at least one conductively plated perforation comprises a plurality of conductively plated perforations positioned on the periphery of the substrate.

23. The sensor of claim 20, further comprising at least one other biometric image sensing element formed on the other of the first side surface and the second side surface of the substrate remote from the biometric sensor controller integrated circuit and electrically coupled to the biometric sensor controller integrated circuit, wherein the at least one other biometric image sensing element transmits information to the biometric sensor controller integrated circuit.

24. The sensor of claim 20, wherein the biometric sensor array comprises an array of capacitive gap biometric object image pixel elements.

25. The sensor of claim 24, wherein the array of capacitive gap biometric object image pixels comprises a linear array.

26. The sensor of claim 20, wherein the substrate is mounted on another substrate, the another substrate comprising a ball grid array mounting configured for connecting the biometric sensor to an apparatus utilizing the biometric sensor.

27. A method of constructing a biometric sensor comprising:
provides a substrate comprising a first side surface and a second side surface opposing the first surface;
providing a biometric sensor portion comprising biometric image sensing elements formed on the second side surface forming at least part of a biometric sensor array sensing capacitively induced changes induced by a biometric in the vicinity of the biometric image sensing elements;
providing a biometric sensor controller integrated circuit mounted to the substrate on one of the first side surface and the second side surface of the substrate;
punching via holes at least partially through the substrate along at least a portion of a perimeter of the substrate;
plating the via holes with a conductive material; and
electrically connecting the plating of at least some of the vias holes to an electrostatic discharge element formed on or as part of the substrate.

28. The method of claim 27, wherein the electrostatic discharge element comprises an electrostatic discharge element trace formed on one of the first side or the second side of the substrate.

29. The method of claim 27, further comprising attaching the substrate to another substrate having a ball grid array on a bottom surface of the another substrate.

30. The method of claim 27, wherein the via holes are punched along the entire perimeter of the substrate.

31. The method of claim 29, wherein the substrate and the another substrate are coupled together.

* * * * *